US010756442B2

(12) United States Patent
Kanar et al.

(10) Patent No.: US 10,756,442 B2
(45) Date of Patent: Aug. 25, 2020

(54) RADIO-FREQUENCY SIGNAL SHIELDING AND CHANNEL ISOLATION

(71) Applicant: Integrated Device Technology, Inc., San Jose, CA (US)

(72) Inventors: Tumay Kanar, San Diego, CA (US); Chih-Hsiang Ko, San Diego, CA (US); Samet Zihir, San Diego, CA (US)

(73) Assignee: Integrated Device Technology, Inc. CA (US)

( * ) Notice: Subject to any disclaimer, the term of this patent is extended or adjusted under 35 U.S.C. 154(b) by 207 days.

(21) Appl. No.: 16/128,976

(22) Filed: Sep. 12, 2018

(65) Prior Publication Data

US 2019/0089048 A1   Mar. 21, 2019

Related U.S. Application Data

(60) Provisional application No. 62/559,875, filed on Sep. 18, 2017, provisional application No. 62/560,173, filed on Sep. 18, 2017.

(51) Int. Cl.
*H01Q 1/38* (2006.01)
*H01Q 21/00* (2006.01)
(Continued)

(52) U.S. Cl.
CPC ....... *H01Q 21/0006* (2013.01); *H01Q 1/2283* (2013.01); *H01Q 1/48* (2013.01); *H01Q 1/523* (2013.01); *H01Q 1/526* (2013.01); *H01Q 3/28* (2013.01); *H01Q 3/36* (2013.01); *H01Q 19/30* (2013.01); *H01Q 21/0025* (2013.01); *H01Q 21/062* (2013.01); *H01Q 21/065* (2013.01); *H03F 1/0211* (2013.01); *H03F 1/0261* (2013.01); *H03F 1/3282* (2013.01); *H03F 1/565* (2013.01); *H03F 3/19* (2013.01); *H03F 3/195* (2013.01); *H03F 3/245* (2013.01); *H03F 3/45089* (2013.01); *H03F 3/45475* (2013.01); *H03F 3/68* (2013.01); *H03G 3/3042* (2013.01);
(Continued)

(58) Field of Classification Search
CPC ............ H01Q 1/24; H01Q 21/00; H01Q 1/48; H01Q 1/523; H01Q 1/526; H01Q 1/2283; H01Q 19/30; H01Q 3/28; H01Q 21/0025
USPC .................................................. 343/700 MS
See application file for complete search history.

(56) References Cited

U.S. PATENT DOCUMENTS

| 6,680,698 B2 * | 1/2004 | Eiges ....................... H01Q 1/28 342/361 |
| 10,281,571 B2 * | 5/2019 | Brookner ................ G01S 13/42 |

(Continued)

*Primary Examiner* — Huedung X Mancuso
(74) *Attorney, Agent, or Firm* — Christopher P. Maiorana, PC

(57) ABSTRACT

An apparatus includes a package and a beam former circuit. The package may be configured to be mounted on an antenna array at a center of four antenna elements. The beam former circuit may (i) be disposed in the package, (ii) have a plurality of ports, (iii) be configured to generate a plurality of radio-frequency signals in the ports while in a transmit mode and (iv) be configured to receive the radio-frequency signals at the ports while in a receive mode. A plurality of ground bumps may be disposed between the beam former circuit and the package. The ground bumps may be positioned to bracket each port. Each ground bump may be electrically connected to a signal ground to create a radio-frequency shielding between neighboring ports.

19 Claims, 14 Drawing Sheets

(51) Int. Cl.

| | | |
|---|---|---|
| H04B 1/44 | (2006.01) | |
| H03F 1/56 | (2006.01) | |
| H03F 3/19 | (2006.01) | |
| H03G 3/30 | (2006.01) | |
| H03F 3/24 | (2006.01) | |
| H03F 1/32 | (2006.01) | |
| H03F 3/195 | (2006.01) | |
| H03F 3/45 | (2006.01) | |
| H03F 3/68 | (2006.01) | |
| H04B 1/04 | (2006.01) | |
| H04B 1/18 | (2006.01) | |
| H04B 1/48 | (2006.01) | |
| H03K 21/10 | (2006.01) | |
| H04B 7/06 | (2006.01) | |
| H01Q 1/52 | (2006.01) | |
| H01Q 3/28 | (2006.01) | |
| H01Q 3/36 | (2006.01) | |
| H01Q 19/30 | (2006.01) | |
| H01Q 21/06 | (2006.01) | |
| H03F 1/02 | (2006.01) | |
| H01Q 1/48 | (2006.01) | |
| H01Q 1/22 | (2006.01) | |
| H03H 7/48 | (2006.01) | |
| H04B 1/401 | (2015.01) | |

(52) U.S. Cl.
CPC ............ *H03H 7/487* (2013.01); *H03K 21/10* (2013.01); *H04B 1/0458* (2013.01); *H04B 1/18* (2013.01); *H04B 1/401* (2013.01); *H04B 1/44* (2013.01); *H04B 1/48* (2013.01); *H04B 7/0617* (2013.01); *H03F 2200/294* (2013.01); *H03F 2200/387* (2013.01); *H03F 2200/451* (2013.01)

(56) References Cited

U.S. PATENT DOCUMENTS

2019/0221947 A1* 7/2019 Zihir .................... H01Q 21/245
2019/0356279 A1* 11/2019 Korol .................... H03F 1/0266
2020/0091608 A1* 3/2020 Alpman .................. H01Q 5/47

* cited by examiner

RADIO-FREQUENCY SIGNAL SHIELDING AND CHANNEL ISOLATION

This application relates to U.S. Provisional Application No. 62/559,875, filed Sep. 18, 2017, and U.S. Provisional Application No. 62/560,173, filed Sep. 18, 2017, each of which are hereby incorporated by reference in their entirety.

FIELD OF THE INVENTION

The invention relates to radio-frequency beam forming generally and, more particularly, to a method and/or apparatus for implementing radio-frequency shielding and channel isolation.

BACKGROUND

Conventional high-frequency wireless communications systems are implemented with dense on-chip circuitry and closely spaced input/output ports. The small distances between the on-chip circuits and the small distances between the input/output ports result in parasitic coupling between high-frequency channels. The parasitic coupling degrades a performance of the wireless communication systems.

It would be desirable to implement radio-frequency shielding and channel isolation.

SUMMARY

The invention concerns an apparatus including a package and a beam former circuit. The package may be configured to be mounted on an antenna array at a center of four antenna elements. The beam former circuit may (i) be disposed in the package, (ii) have a plurality of ports, (iii) be configured to generate a plurality of radio-frequency signals in the ports while in a transmit mode and (iv) be configured to receive the radio-frequency signals at the ports while in a receive mode. A plurality of ground bumps may be disposed between the beam former circuit and the package. The ground bumps may be positioned to bracket each port. Each ground bump may be electrically connected to a signal ground to create a radio-frequency shielding between neighboring ports.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing radio-frequency shielding and channel isolation that may (i) be simple to implement using ground bumps and power bumps between a chip and a printed circuit board, (ii) provide radio-frequency shielding around input/output ports of the chip, (iii) provide the radio-frequency shielding between transmitter channel circuitry and receiver channel circuitry in the chip, (iv) improve channel isolation, (v) improve chip-to-printed circuit board impedance transitions and/or (vi) be implemented as one or more integrated circuits.

Figure 1:
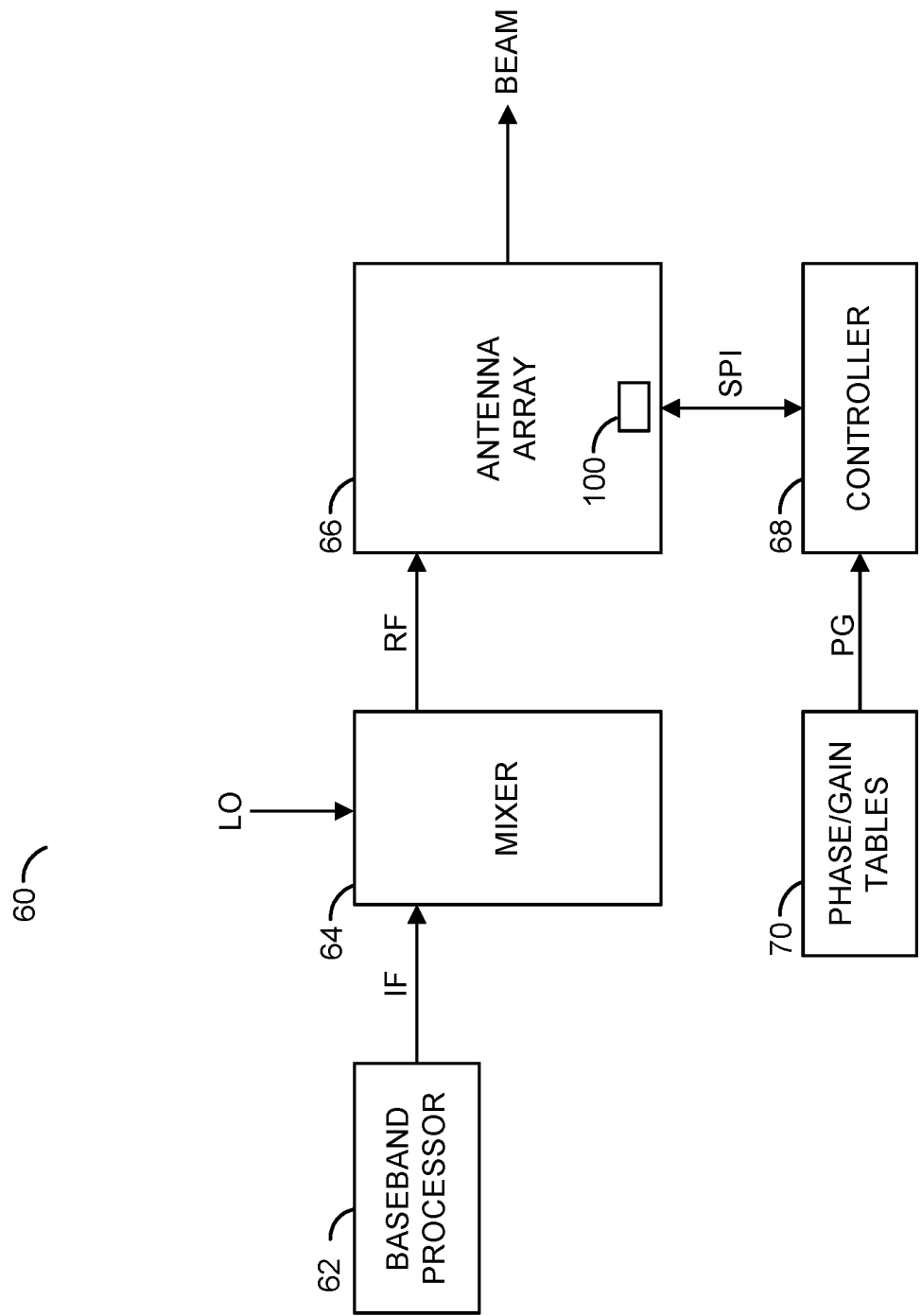
FIG. 1 is a diagram of a radio-frequency transceiver system illustrating a context of the invention in accordance with an example embodiment of the invention.

Referring to FIG. 1, a diagram of a system 60 illustrating a context of the invention is shown in accordance with an example embodiment of the invention. The system (or module or circuit or apparatus) 60 may implement a radio-frequency (RF) transceiver system in accordance with an example embodiment of the invention. The RF transceiver system 60 may be configured to operate at common wireless radio frequencies, millimeter-wave frequencies, and/or microwave frequencies. In various embodiments, the RF transceiver system 60 may form part of a long range communications link. In various embodiments, the long range communications link may be part of a fifth generation (5G) wireless communications system (e.g., for which a standard is currently under development by the Next Generation Mobile Networks (NGMN) Alliance). In other embodiments, the long range communications link may be part of a fourth generation (4G) wireless communications system (e.g., International Mobile Telecommunications-Advanced (IMT-A) standard published by the International Telecommunications Unit Radiocommunication Sector (ITU-R)). However, other communications standards may be implemented to meet the design criteria of a particular application.

The RF transceiver system 60 generally comprises a block (or circuit) 62, a block (or circuit) 64, a block (or circuit) 66, a block (or circuit) 68 and a block (or circuit) 70. The circuit 66 generally comprises multiple blocks (or circuits) 100 (one shown for clarity). The circuits 62-100 may be implemented with hardware, a combination of hardware and software and/or simulated with software.

A signal (e.g., IF) may be exchanged between the circuits 32 and the circuit 64. The signal IF may implement an intermediate-frequency signal carrying information to be transmitted with a vertical polarization from and/or received by the RF transceiver system 60. A signal (e.g., LO) may be received by the circuit 64. The signal LO may implement a local oscillator signal. A signal (e.g., RF) may be exchanged between the circuit 64 and the circuit 66. The signal RF may be a radio-frequency signal that conveys the information also found in the intermediate-frequency signal IF. In a transmit mode, the radio-frequency signal RF may convey information to broadcast from the circuit 66. In a receive mode, the radio-frequency signal RF may convey information received by the circuit 66. A field (e.g., BEAM) may be generated by the circuit 66. The field BEAM may represent a field pattern (or a radio-frequency beam pattern) created by the circuit 66. A signal (e.g., SPI) may be exchanged between the circuit 66 and the circuit 68. The signal SPI may convey data, clocking and control elements. A signal (e.g., PG) may be transferred from the circuit 70 to the circuit 68. The signal PG may convey phase information and gain information used by the circuits 66 and 68 to control steering of the field BEAM.

The circuit 62 may implement a baseband processor circuit. The processor 62 is generally operational to process the information sent by and/or received in the intermediate-frequency signal IF. The processing may include, but is not limited to, modulation/demodulation of the radio signal that contains the information and management of simultaneous communications between the RF transceiver system 60 and multiple remote terminals.

The circuit 64 may implement a mixer circuit. The mixer 64 is generally operational to frequency convert between an intermediate frequency used for the signal IF and the radio frequency used for the signal RF. The frequency conversion may be based on a local oscillator frequency of the local oscillator signal LO. In various embodiments, the radio-frequency signal RF may be in a range of frequencies centered around approximately 28 gigahertz (GHz) or 39 GHz (e.g., 24 GHz to 30 GHz or 37 GHz to 44 GHz). The intermediate frequency may cover a band from approximately 2 GHz to 6 GHz (e.g., an approximately 4-GHz bandwidth). The local oscillator frequency may range from approximately 22 GHz to 26 GHz while the signal RF is at 28 GHz. The local oscillator frequency may range from approximately 33 GHz to 37 GHz while the signal RF is at 39 GHz. Other frequency ranges may be implemented to meet the design criteria of a particular application.

The circuit 66 may implement an antenna array. The array 66 may be operational to transmit and receive wireless signals to and from devices (or terminals) remotely located from the RF transceiver system 60. Sensitivity to the wireless signals may be determined by the field BEAM created by the antenna array 66. The antenna array 66 may comprise a number (e.g., N) of antenna elements and a similar number of transceiver channels. The N transceiver channels may be coupled by the corresponding bidirectional radio-frequency signals to the N antenna elements. The transceiver channels and antenna elements generally form a two-dimensional antenna network. In various embodiments, the antenna array 66 may be implemented as a patch antenna or a phased array antenna.

The circuit 68 may implement a controller circuit. The controller 68 is generally operational to control the operations of the antenna array 66. In some embodiments, the controller 68 may determine the setting values used in each transceiver channel within the beam former circuit 66 to establish the geometry of the field BEAM. In various embodiments, the controller 68 may be implemented as one or more integrated circuits.

The circuit 70 may implement a table in a memory circuit. The table 70 may be configured to store multiple gain values and multiple phase values used by the transceiver channels in the antenna array 66 to establish the field BEAM. The phase values and the gain values may be loaded from the table 70 into buffers within array 66 by the controller 68. In various embodiments, the memory storing the table 70 may be implemented on the same integrated circuit as the controller 68.

Each circuit 100 may implement a beam former circuit. The beam formers 100 are generally operational to multiplex/demultiplex the signal RF with multiple antenna elements in the antenna array 66. The beam formers 100 may also be operational to control the shape, direction and magnitude of the field BEAM based on phase information and gain information received through the signal SPI.

Figure 2:
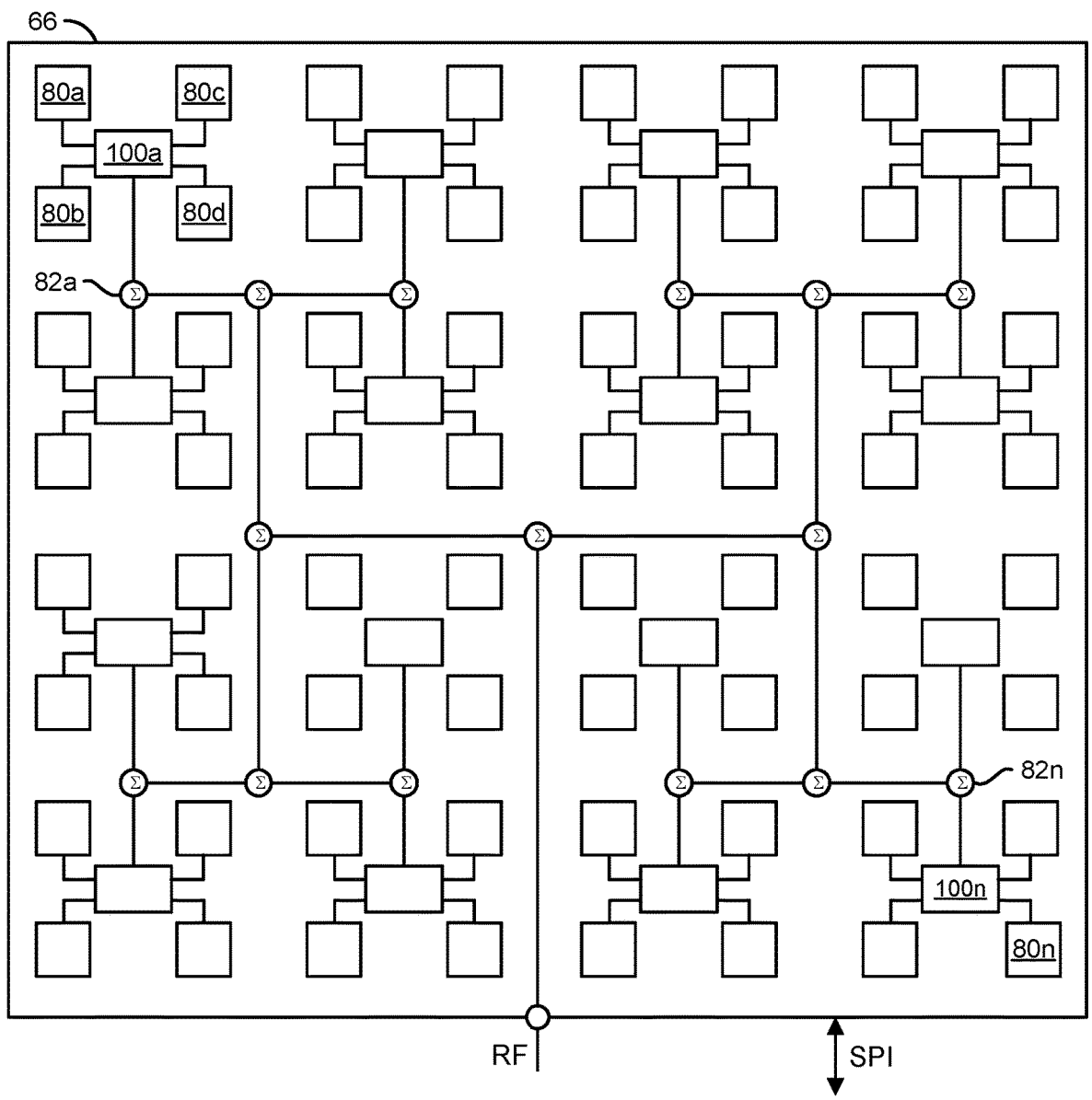
FIG. 2 is a diagram of an antenna array of the system in accordance with an example embodiment of the invention.

Referring to FIG. 2, a diagram of an example implementation of the antenna array 66 is shown in accordance with an example embodiment of the invention. The array 66 generally comprises multiple blocks (or circuits) 80$a$-80$n$, multiple blocks (or circuits) 82$a$-82$n$ and multiple blocks (or circuits) 100$a$-100$n$. The circuits 80$a$-100$n$ may be implemented with hardware, a combination of hardware and software and/or simulated with software.

The signal RF may be distributed among the circuits 82$a$-82$n$. The signal SPI may be exchanged with all of the circuits 100$a$-100$n$.

Each circuit 80$a$-80$n$ may implement an antenna element. The elements 80$a$-80$n$ in the array 66 may be used for both transmission and reception. A physical positioning of the elements 80$a$-80$n$ generally provides a two-dimensional (e.g., horizontal and vertical) control of the field BEAM.

Each circuit 82$a$-82$n$ may implement a combiner circuit. In various embodiments, each combiner 82$a$-82$n$ may be implemented as a Wilkinson combiner circuit. In the transmit mode, the combiners 82$a$-82$n$ are generally operational to distribute the power in the signal RF to the circuits 100$a$-100$n$. In the receive mode, the combiners 82$a$-82$n$ may be operational to combine the power received in signals from the circuits 100$a$-100$n$ into the signal RF.

Each circuit 100$a$-100$n$ may implement one of the beam formers 100. The beam formers 100$a$-100$n$ are generally operational to multiplex/demultiplex the signal RF with multiple (e.g., N) antenna elements 80$a$-80$n$. The beam formers 100$a$-100$n$ may also be operational to change setting values rapidly (e.g., phase values and gain values) used by the transceiver channels to steer the field BEAM formed by the antenna array 66. In various embodiments, each beam former 100$a$-100$n$ may be implemented as one or more integrated circuits in a package. Each packed beam former 100$a$-100$n$ may be mounted on a substrate of the antenna array 66 at a center of four neighboring antenna elements 80$a$-80$n$.

Figure 3:
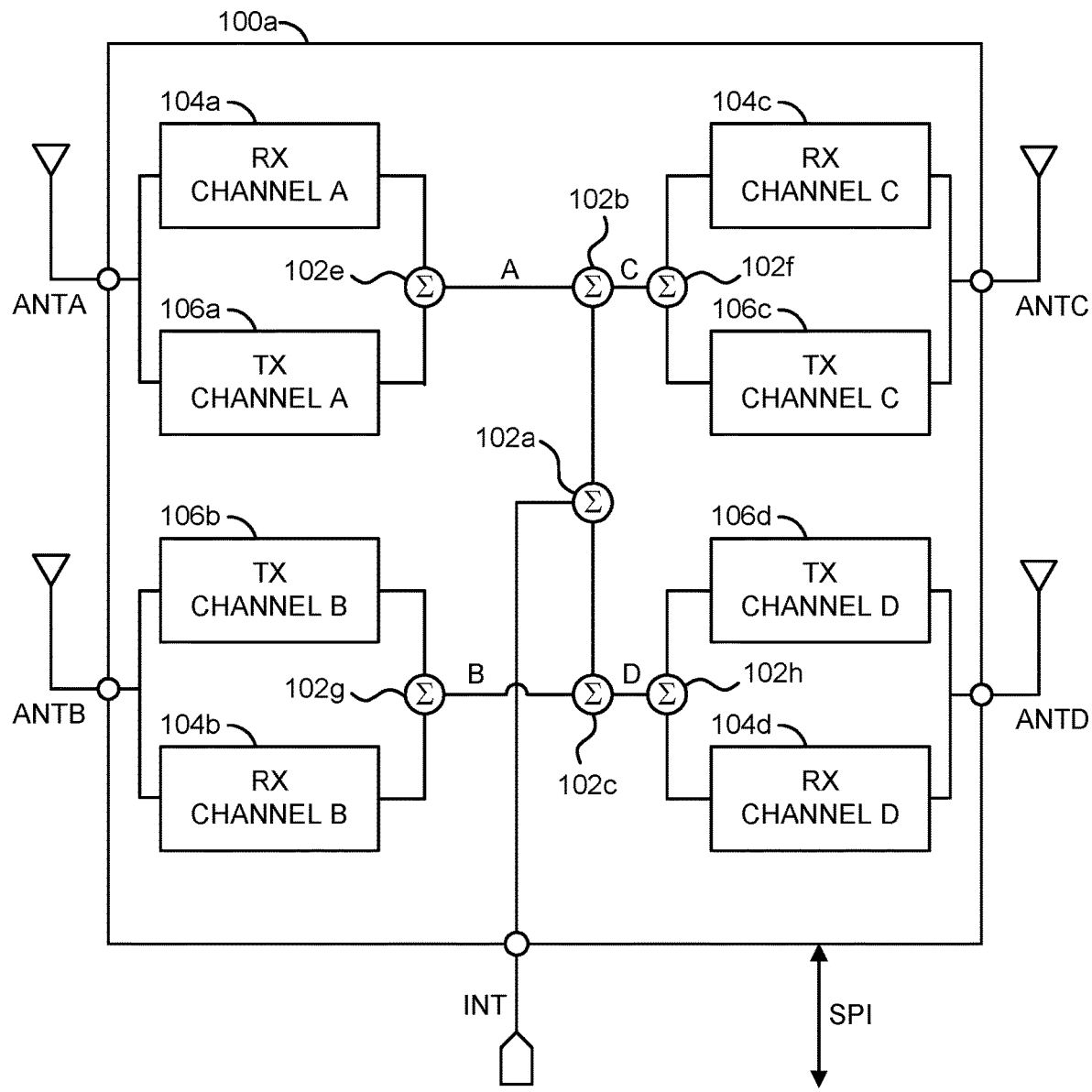
FIG. 3 is a diagram of a beam former of the system in accordance with an example embodiment of the invention.

Referring to FIG. 3, a diagram of an example implementation of a beam former 100$a$ is shown in accordance with an example embodiment of the invention. The beam former 100$a$ may be representative of each beam former 100$a$-100$n$. The beam former 100$a$ generally comprises multiple blocks (or circuits) 102$a$-102$g$, multiple blocks (or circuits) 104$a$-104$d$ and multiple blocks (or circuits) 106$a$-106$d$. The circuits 102a-106d may be implemented with hardware, a combination of hardware and software and/or simulated with software.

A signal (e.g., INT) may be exchanged with a circuit 102a. The signal INT may represent an intermediate version of the signal RF. The signal INT and the signal RF may be related through the combiner circuits 82a-82n. Multiple signals (e.g., A-D) may be exchanged among the circuits 104a-104d, the circuits 106a-106d and the circuits 102b-102g. In a transmit mode, the signals A-D may be radio-frequency signals to be amplified by the circuits 106a-106d. In a receive mode, the signals A-D may be received radio-frequency signals amplified by the circuits 104a-104d. Multiple signals (e.g., ANTA-ANTD) may be exchanged among the antenna elements 80a-80n (e.g., 80a-80d) and the circuits 104a-104d and the circuits 106a-106d. In the transmit mode, the signals ANTA-ANTD may be outgoing radio-frequency signals being broadcasted by the array 66. In the receive mode, the signals ANTA-ANTD may be incoming radio-frequency signals received by the array 66.

Each circuit 102a-102g may implement a combiner circuit. In various embodiments, each combiner circuit 102a-102g may be implemented as a Wilkinson combiner circuit. In the transmit mode, the combiner circuits 102a-102g are generally operational to distribute the power in the common signal INT to the circuits 106a-106d. In the receive mode, the combiner circuits 102a-102g may be operational to combine the power received in signals A-D from the circuits 104a-104d into the signal INT.

Each circuit 104a-104d may implement a receiver (RX) channel circuit. In the receive mode, the receiver channels 104a-104d may be operational to amplify the radio-frequency signals ANTA-ANTD and present the amplified signals back to the combiner circuits 102a-102g. The phase values and the gain values used by the receiver channels 104a-104d may be loaded from the table 70 via the controller 68 and the signal SPI. The phase values and the gain values may be used to adjust the phases and the amplitudes of the radio-frequency signals to steer the field BEAM.

Each circuit 106a-106d may implement a transmitter (TX) channel circuit. In the transmit mode, the transmitter channels 106a-106d are generally operational to amplify the signals A-D received from the combiners 102a-102g to generate the radio-frequency signals ANTA-ANTD. The phase values and the gain values used by the transceiver channels 104a-104d may be loaded from the table 70 via the controller 68 and the signal SPI. The phase values and the gain values may be used to adjust the phases and the amplitudes of the radio-frequency signals to steer the field BEAM.

Figure 4:
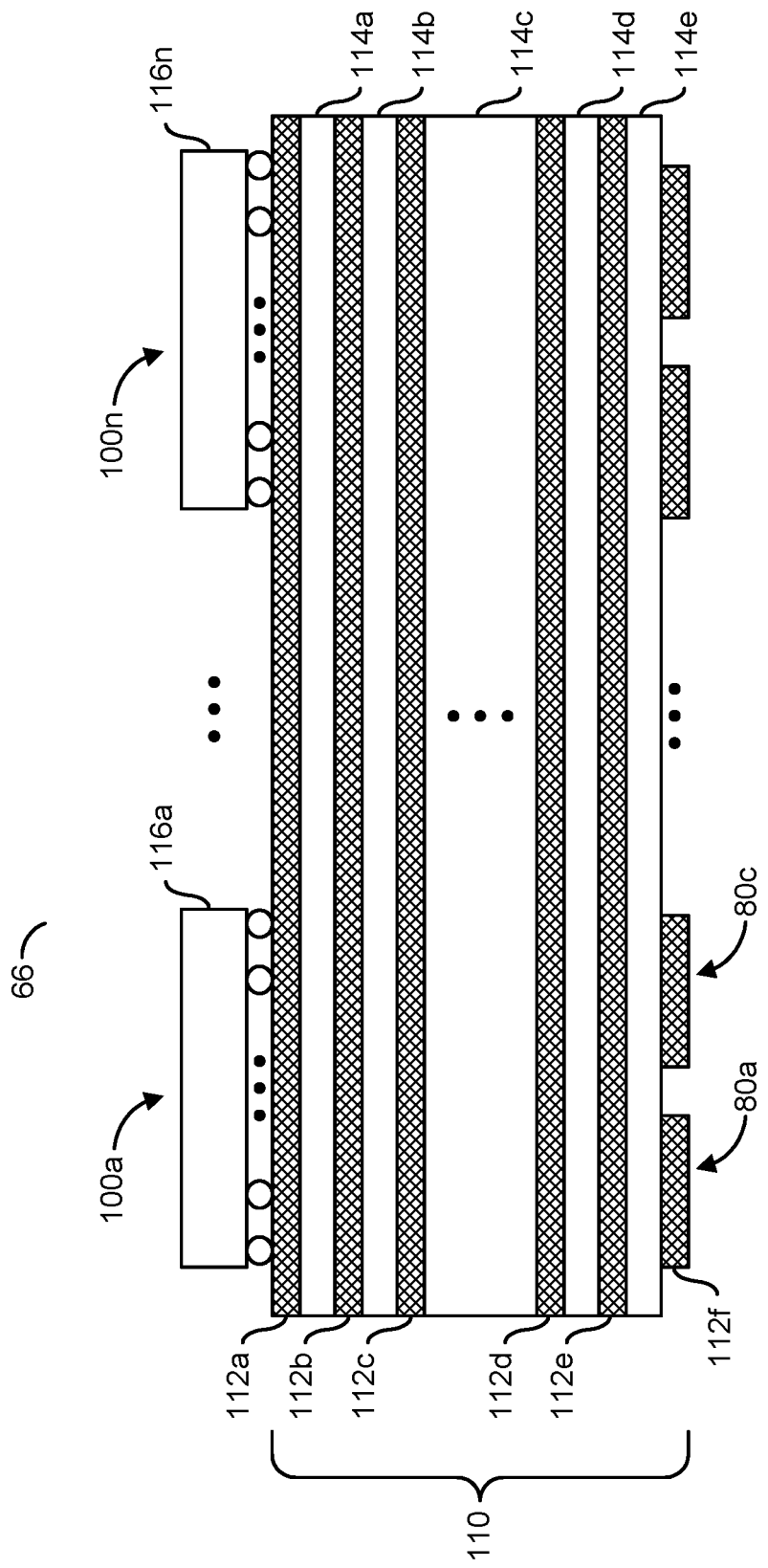
FIG. 4 is a cross-sectional diagram of an antenna array of the system in accordance with an example embodiment of the invention.

Referring to FIG. 4, a cross-sectional diagram of an example implementation of the array 66 is shown in accordance with an example embodiment of the invention. The array 66 generally comprises the elements 80a-80n, the beam formers 100a-100n, and a substrate (or printed circuit board) 110. The substrate 110 generally comprises multiple layers 112a-112f and one or more layers 114a-114e. Each beam former 100a-100n may be sealed in a respective protective package (or housing) 116a-116n.

The substrate 110 may be implemented as a printed circuit board. The substrate 110 generally provides mechanical support for the beam formers 100a-100n and the elements 80a-80n. Traces on and through the substrate 110 may provide electrical connections between the elements 80a-80n, the beam formers 100a-100n, connections to the controller 68, and connections to the mixer 64.

Each layer 112a-112f may be implemented as a conductive (or metal) layer. The conductive layers 112a-112f may provide the traces that interconnect the elements 80a-80n and the beam formers 100a-100b. One or more of the conductive layers 112a-112f may provide the electrical connections to the controller 68 and the mixer 64. Inter-layer vias may be provided between the conductive layers 112a-112f to achieve layer-to-layer connections.

Each layer 114a-114f may be implemented as an insulating layer. The insulating layers 114a-114f generally provide electrical isolation between the conductive layers 112a-112f. The insulating layers 114a-114f may also provide for mechanical stiffness.

The beam formers 100a-100n may be mounted on a side of the substrate 110 (e.g., a top side as oriented in the figure). The elements 80a-80n may be formed in one or more outer conductive layers (e.g., 112f) on a side of the substrate 110 opposite the beam formers 100a-100n (e.g., a bottom side as oriented in the figure). Electrical feeds that extend through the substrate 110 may be used to electrically connect the beam formers 100a-100n to the elements 80a-80n.

Figure 5:
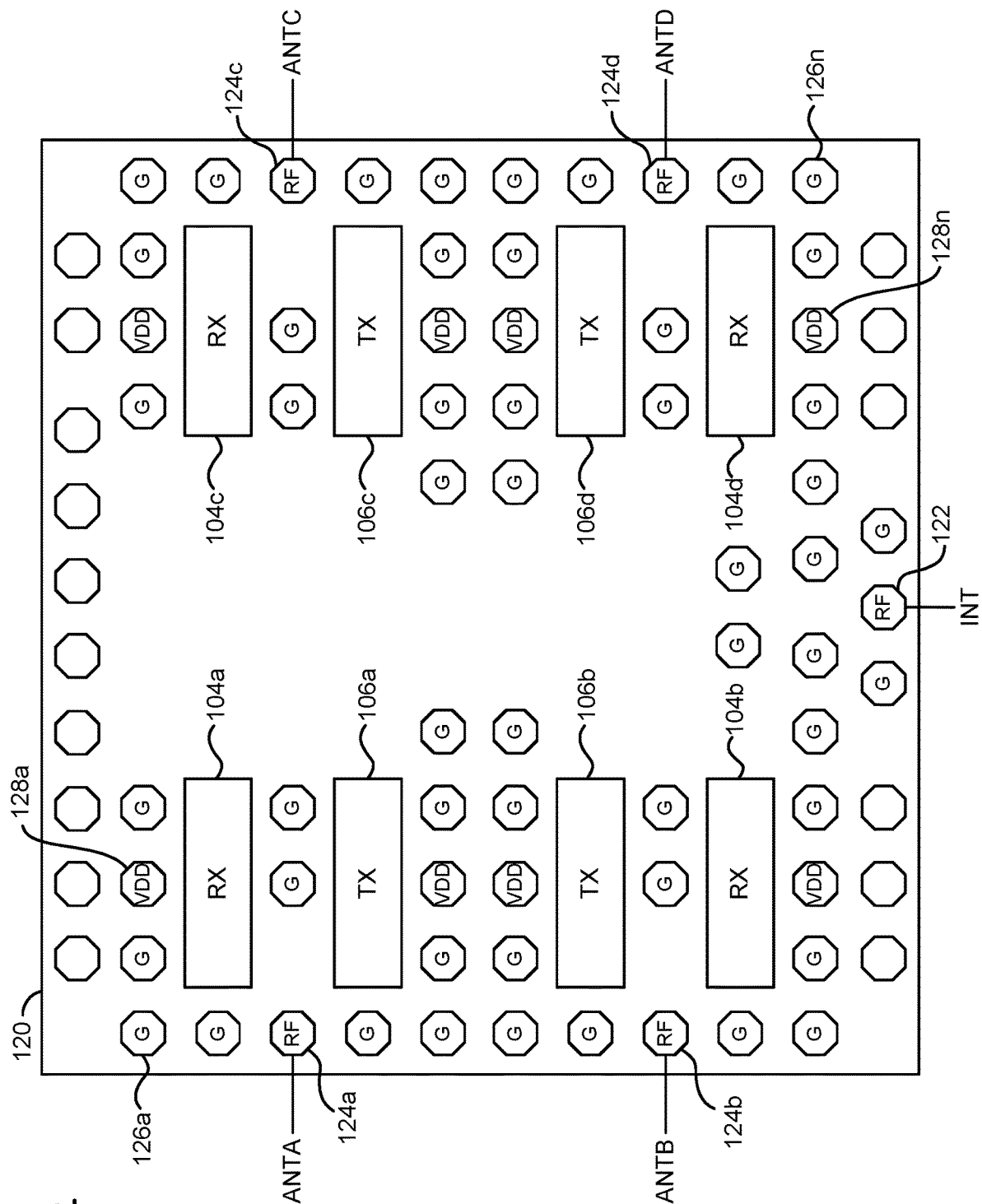
FIG. 5 is a diagram illustrating a solder-bump map for the beam former in accordance with an example embodiment of the present invention.

Referring to FIG. 5, a diagram illustrating an example solder-bump map for a beam former chip 120 is shown in accordance with an example embodiment of the present invention. Orientation and placement of the transmitter channels 104a-104d, the receiver channels 106a-106d, the input/output nodes, ground solder bumps and power solder bumps may be configured to provide good physical isolation and electrical isolation. The isolation may be enhanced between the signals and between the channels. The map generally illustrates a 4-channel beam former. Other sized maps for other numbers of channels may be implemented to meet the design criteria of a particular application.

Multiple input/output nodes 122 (e.g., the signal INT) and 124a-124d (e.g., the signals ANTA-ANTD) may be positioned and oriented for good isolation. Having the input/output signal-flow directions orthogonal to each other generally helps with the isolation. For example, the pair of input/output nodes (or antenna ports) 124a and 124b for the antenna signals ANTA and ANTE may be on an opposite side of the chip 120 as the pair of input/output nodes 124c and 124d for the antenna signals ANTC and ANTD. The input/output node 122 for the signal INT may be on a different side of the chip 120 as the input/output nodes 124a-124d.

The map may include multiple ground (G) bumps 126a-126n. Some ground bumps 126a-126n may be positioned to provide electrical isolation around the input/output nodes 122 and 124a-124d. Some ground bumps 126a-126n may be posited between the channels 104a-104d and 106a-106d to reduce cross-channel coupling. Furthermore, some ground bumps 126a-126n may be located around the input/output node 122 to help isolate the signal INT.

The map may further include multiple power (VDD) bumps 128a-128n. One or more of the power bumps 128a-128n may be located near to each channel 104a-104d and 106a-106d. The use of closely placed power bumper 128a-128n and closely placed ground bumps 126a-126n may help minimize cross-channel coupling through the power rails. Other bumps may be included to accommodate other signals, power and ground.

Figure 6:
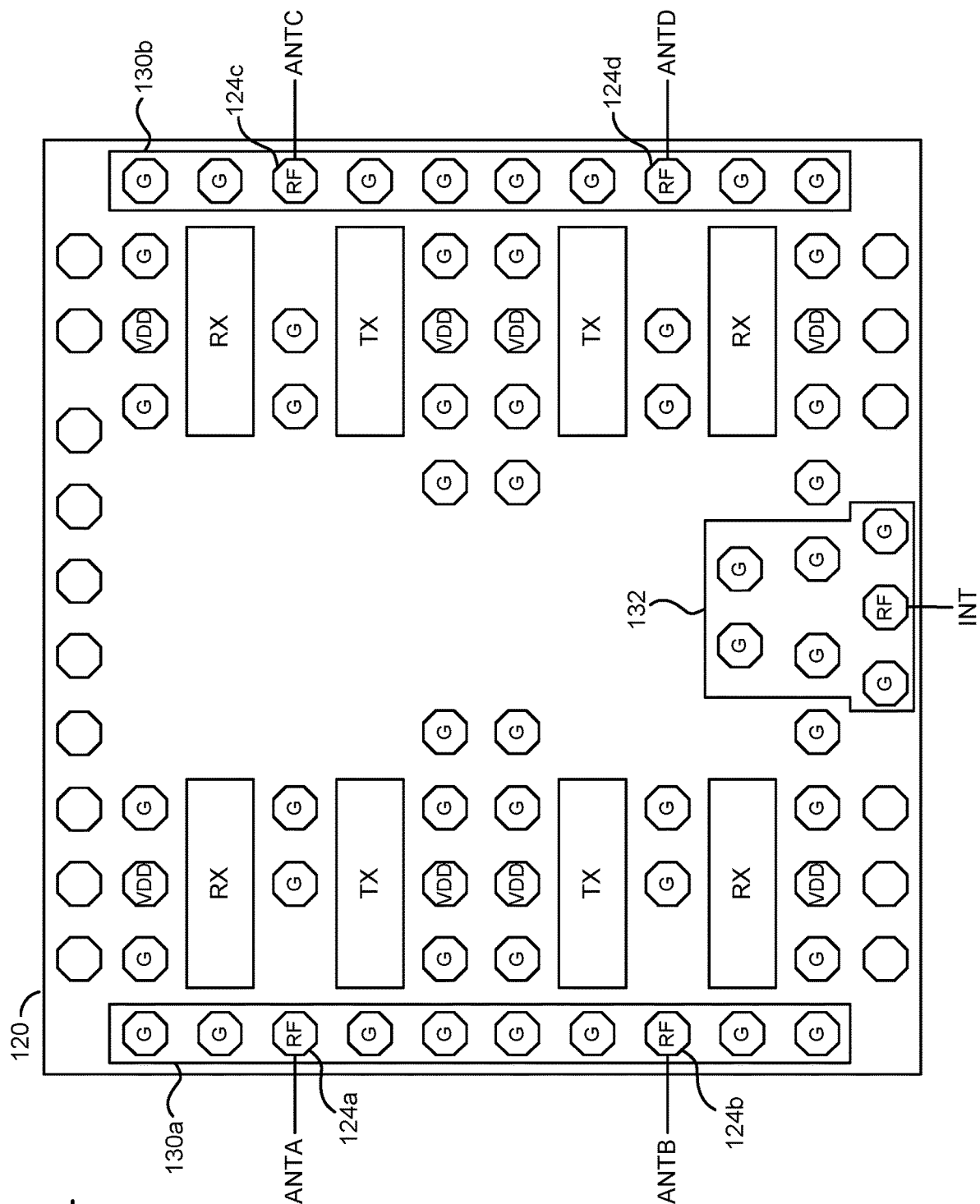
FIG. 6 is a diagram illustrating bump placement for channel-to-channel radio-frequency signal isolation in accordance with an example embodiment of the present invention.

Referring to FIG. 6, a diagram illustrating an example bump placement for channel-to-channel radio-frequency signal isolation is shown in accordance with an example embodiment of the present invention. The ground bumps 126a-126n in proximity of the antenna ports 124a-124d may be located as far as practical from each other and several ground bumps 126a-126n may be located between the antenna ports 124a-124d. For example, in each region 130a-130b two ground bumps 126a-126n may be positioned on either side of the antenna ports 124a-124b and 124c-124d. The ground bumps 126a-126n within the regions 130a-130b may be equally spaced relative to each other and the antenna ports 124a-124b and 124c-124d. The spacing generally provides high isolation between bumps 126a-126n and provides enough space for package interposer traces for both channels adjacent each other.

In a region 132, some ground bumps 126a-126n may surround the input/output port 122 for the signal INT. The local ground bumps 126a-126n may form a well-contained radio-frequency cavity for high isolation between the input/output port 122 and the antenna ports 124a-124d. Other numbers and/or placements of the bumps may be implemented to meet the design criteria of a particular application.

Figure 7:
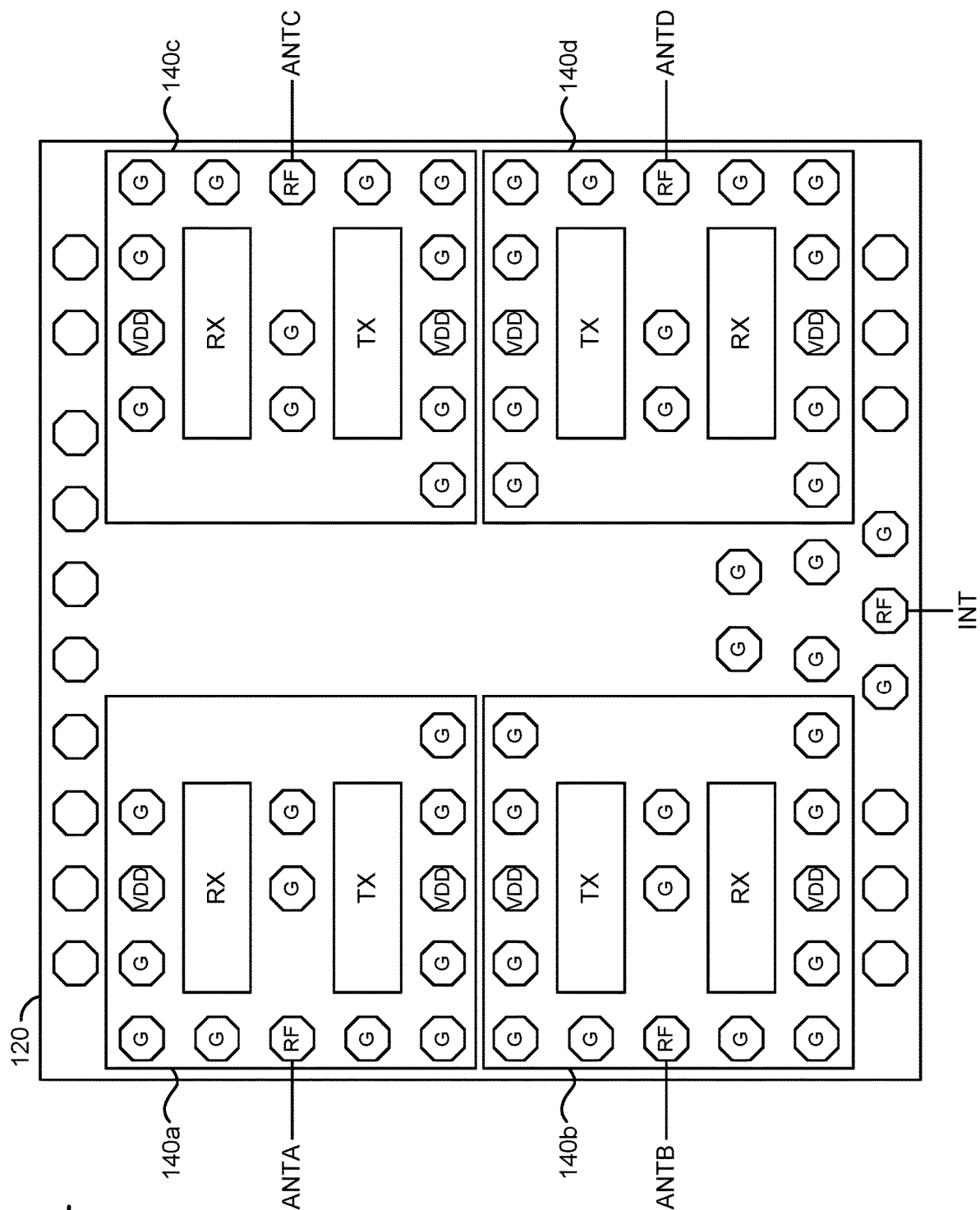
FIG. 7 is a diagram illustrating bump placement around channel circuitry in accordance with an example embodiment of the present invention.

Referring to FIG. 7, a diagram illustrating an example bump placement for the ground bumps 126a-126n around the channels is shown in accordance with an example embodiment of the present invention. Each transceiver channel (e.g., both the receiver channel RX and the transmitter channel TX) corresponding to the signals ANTA-ANTD may be surrounded by the ground bumps 126a-126n and the power bumps 128a-128n in regions 140a-140d. The ground bumps 126a-126n and the power bumps 128a-128n within each region 140a-140d generally create a well-defined radio-frequency cavity for higher isolation between the transceiver channels, between the receiver channel RX and the transmitter channel TX, and may provide a solid ground network for each channel. Other bump patterns and/or other numbers of channels may be implemented to meet the design criteria of a particular application.

Figure 8:
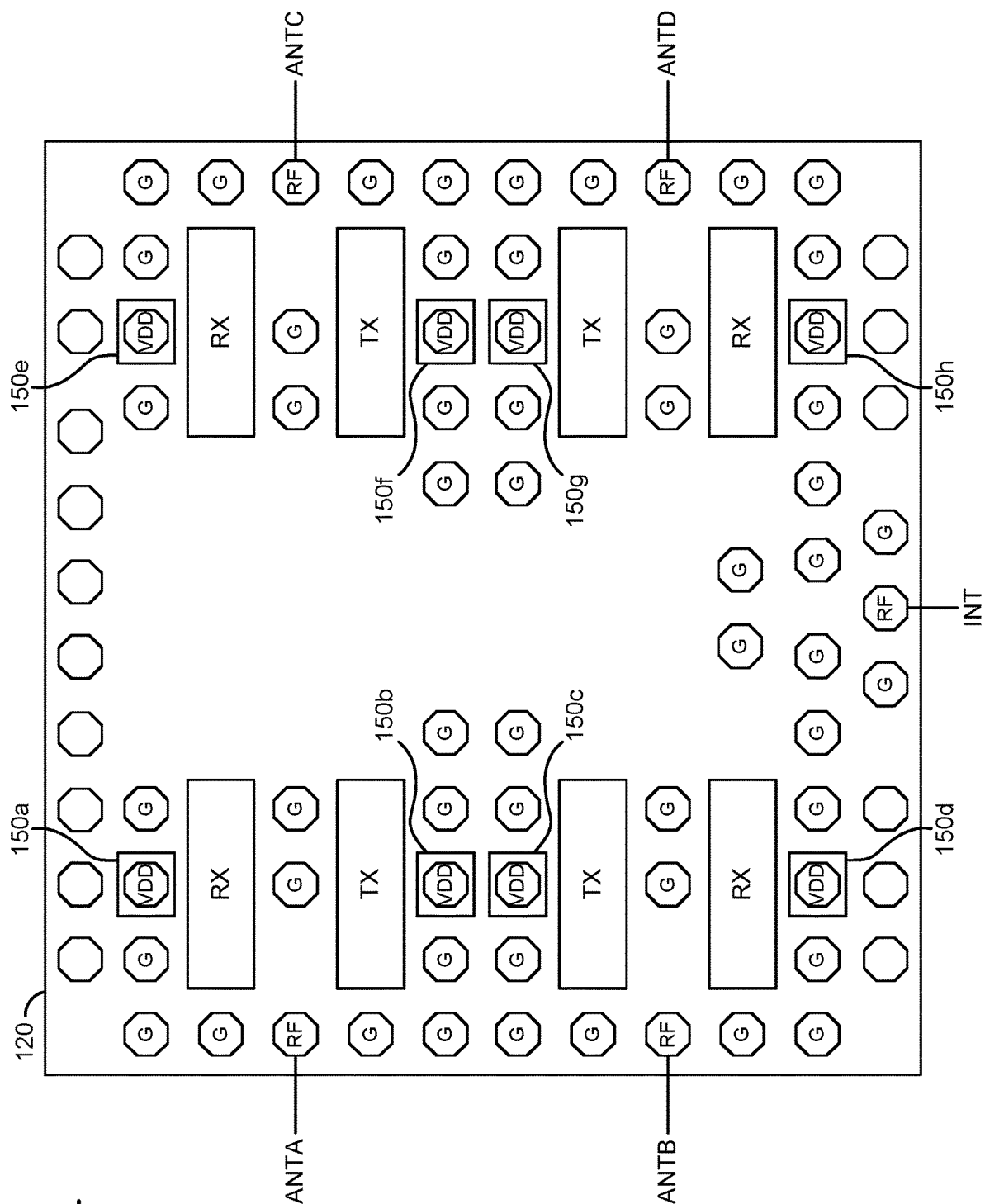
FIG. 8 is a diagram illustrating bump placement for channel-to-channel power isolation in accordance with an example embodiment of the present invention.

Referring to FIG. 8, a diagram illustrating an example bump placement for the power bumps 128a-128n for channel-to-channel power isolation is shown in accordance with an example embodiment of the present invention. A dedicated power bump 128a-128n may be located neighboring (close-by) to each receiver channel RX and each transmitter channel TX in the regions 150a-150h. The one-to-one pairing of the power bumps 128a-128n within the regions 150a-150h to the channels may help minimize electrical power-rail crosstalk between channels. The close proximity of the power bumps VDD to the channels may also minimize I-R drops due to ohmic losses in the integrated circuit conductive (or metal) traces.

Figure 9:
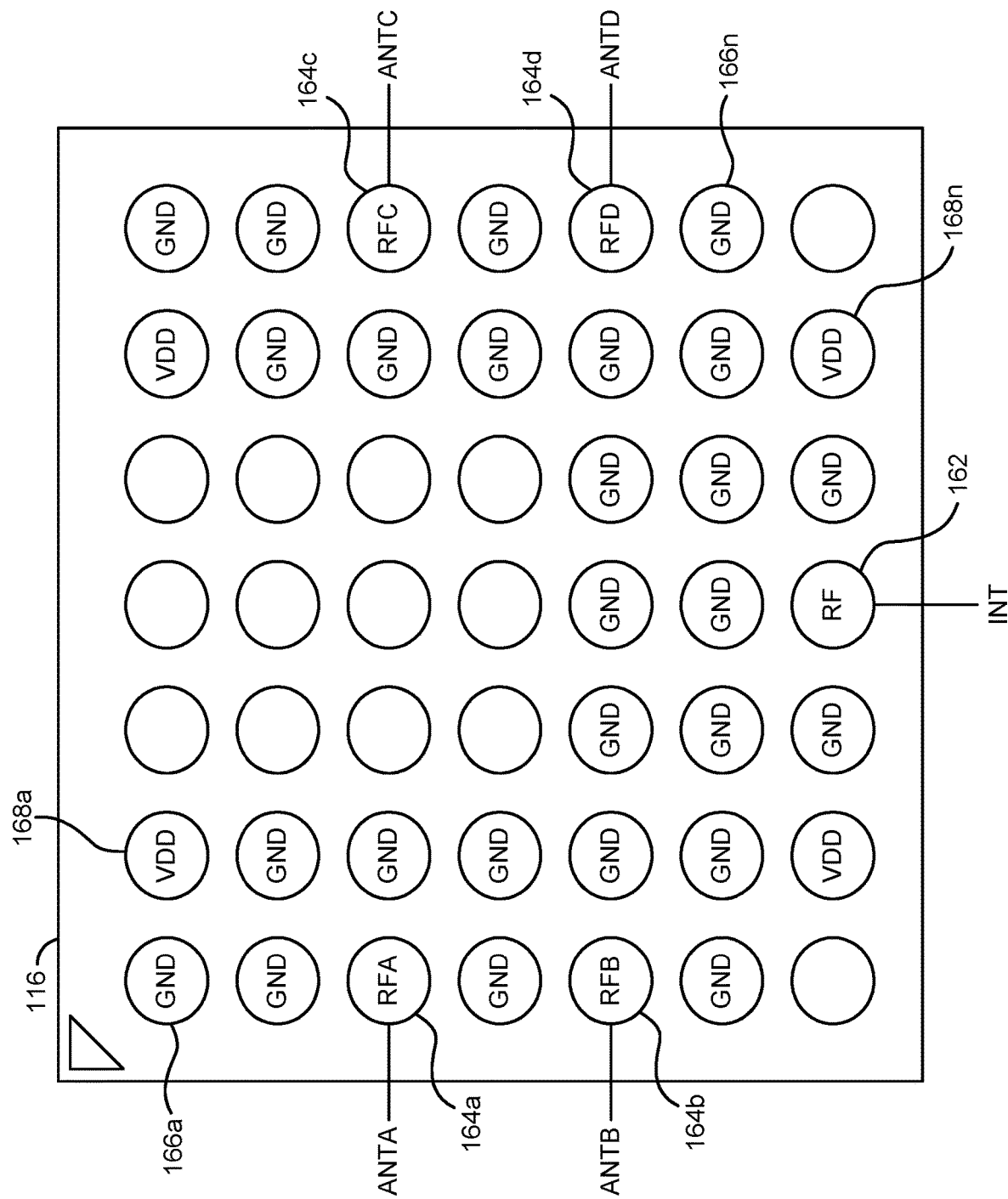
FIG. 9 is a diagram illustrating package ball placement for a single-polarity antenna array in accordance with an example embodiment of the present invention.

Referring to FIG. 9, a diagram illustrating an example package ball placement for a single-polarity antenna array is shown in accordance with an example embodiment of the present invention. The package 116 may be representative of the packages 116a-116n. The package balls may include an intermediate ball 162 for the signal INT, multiple signal balls 164a-164d for the signal ANTA-ANTD, multiple ground balls 166a-166n for the ground signals, and multiple power balls 168a-168n for the power signals. Other package balls may be included to accommodate other signals, power and ground.

The signals, ground and power may be routed within the package 116 between the signal bumps 122 and 124a-124d, the ground bumps 126a-126n and the power bumps 128a-128n and corresponding package balls 162, 164a-164d, 166a-166n and 168a-168n of the package 116. The signals, ground and power may be routed through the package balls 162, 164a-164d, 166a-166n and 168a-168n between the package 116 and the substrate 110 (FIG. 4). A general arrangement of the package balls 162, 164a-164d, 166a-166n and 168a-168n may match the general arrangement of the bumps 122, 124a-124d, 126a-126n and 128a-128n. For example, the package balls 164a-164d for the signals ANTA-ANTD may be spatially close to the bumps 124a-124d for the same signals ANTA-ANTD. A pair of the balls 164a-164b may be disposed on one side of the package 116 while another pair of the balls 164c-164d may be disposed on an opposite side of the package 116. In another example, the package ball 162 for the signal INT may be placed in proximity to the bump 122 for the same signal INT. The ball 162 may be on a third side of the package 116.

Figure 10:
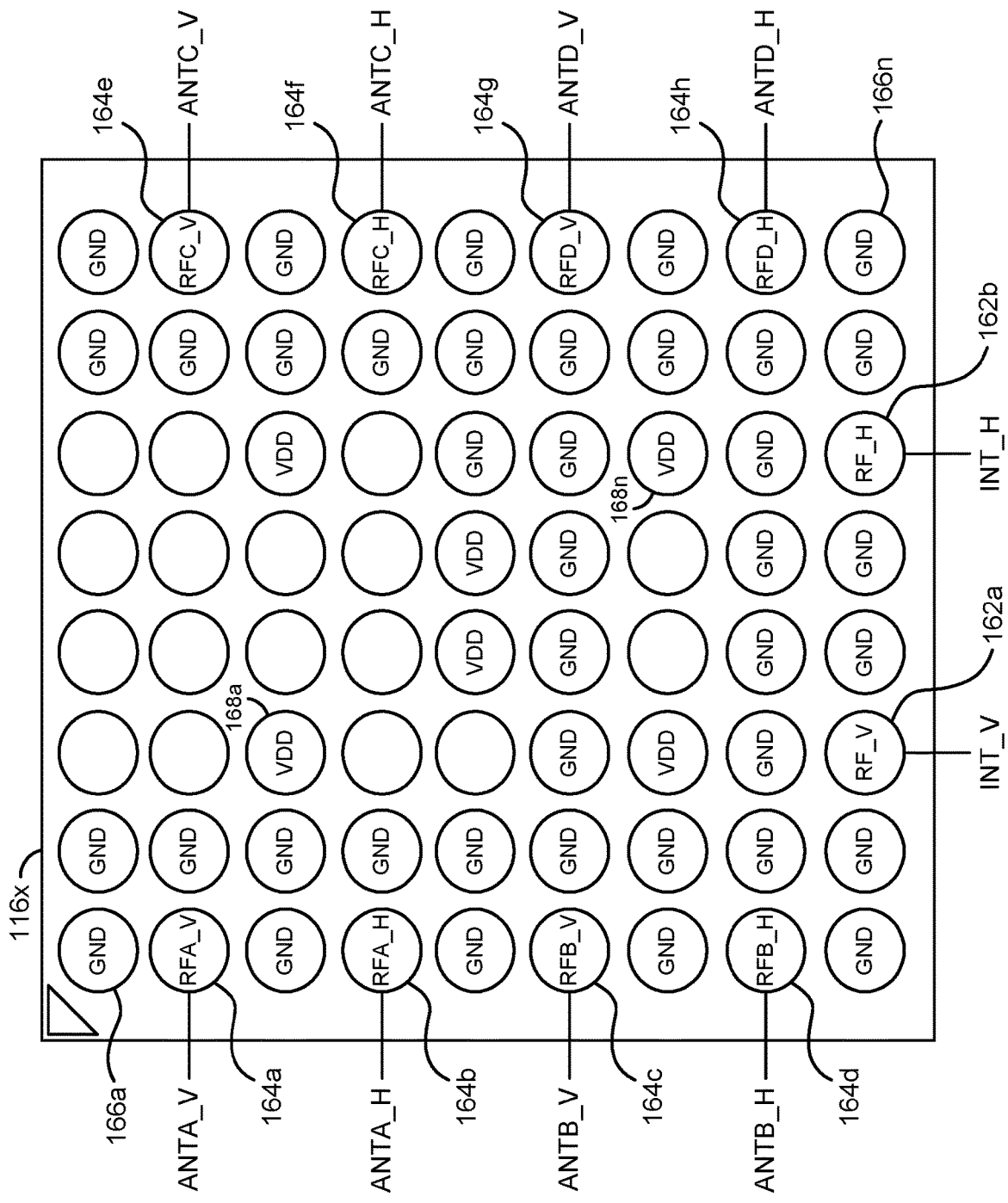
FIG. 10 is a diagram illustrating package ball placement for a dual-polarity antenna array in accordance with an example embodiment of the present invention.

Referring to FIG. 10, a diagram illustrating an example package ball placement for a dual-polarity antenna array is shown in accordance with an example embodiment of the present invention. A package 116x may be representative of the packages 116a-116n. Each signal INT and ANTA-ANTD may be implemented as vertically polarized signals INT_V and ANTA_V to ANTD_V and horizontally polarized signals INT_H and ANTA_H to ANTD_H.

The package balls may include two intermediate balls 162a-162b for the intermediate signals INT_V and INT_H, multiple balls 164a-164h for the antenna signals ANTA_V to ANTD-V and ANTA_H to ANTD_H, multiple ground balls 166a-166n for the ground signals GND, and multiple power balls 168a-168n for the power signals VDD. Other package balls may be included to accommodate other signals, power and ground.

Similar to the ball placement shown in FIG. 9, the balls 164a-164d for the signals ANTA_V/ANTA_H and ANTE_V/ANTB_H may be placed along one side of the package 116x while the balls 164e-164h for the signals ANTC_V/ANTC_H and ANTD_V/ANTD_H may be placed along an opposite side of the package 116x. The balls 162a-162b for the signals INT_V/INT_H may be located on a third side of the package 116x. The ground balls 166a-166n are generally located surrounding all of the radio-frequency bearing balls 162a-162b and 164a-164h.

Figure 11:
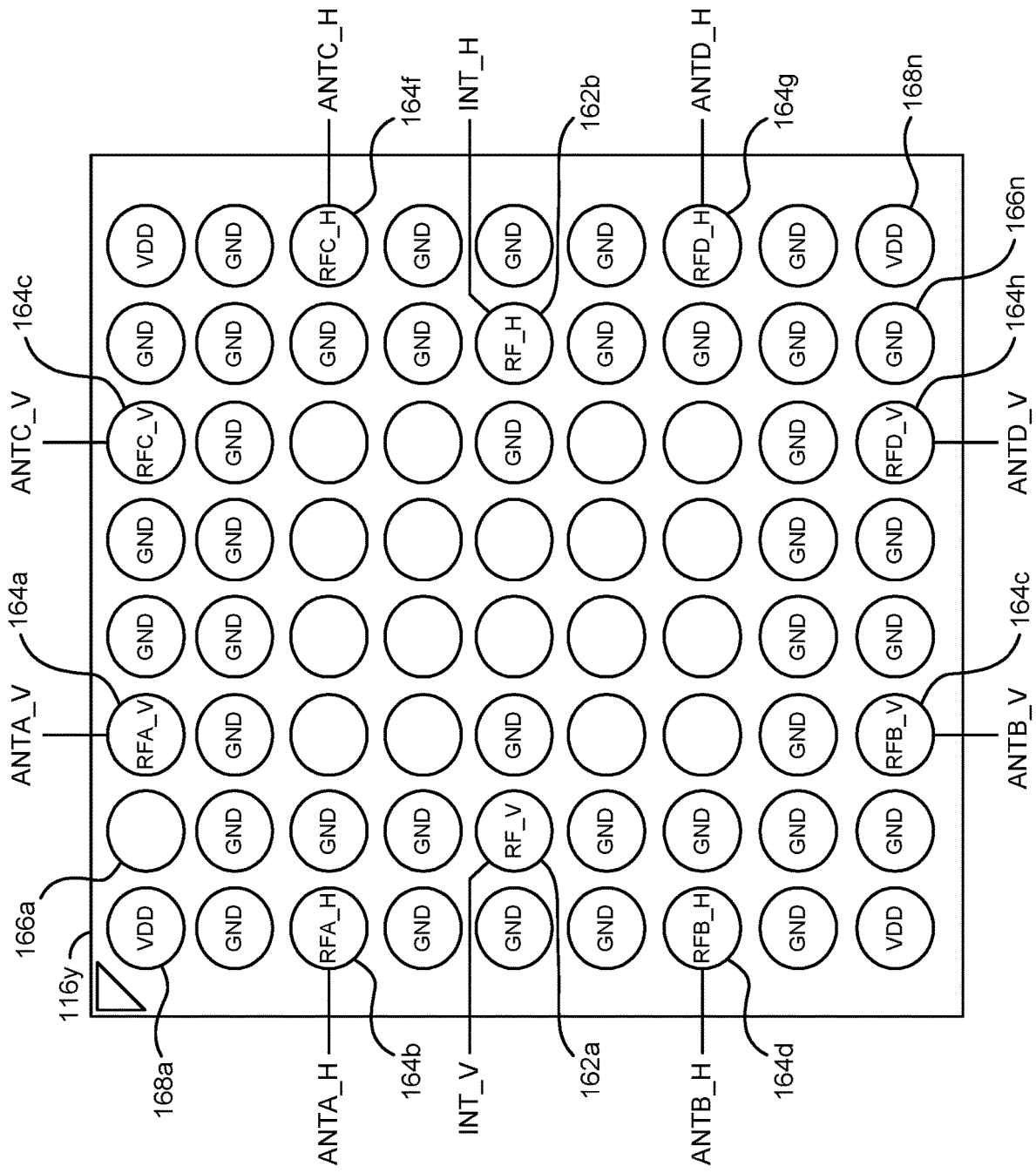
FIG. 11 is a diagram illustrating another package ball placement for a dual-polarity antenna array in accordance with an example embodiment of the present invention.

Referring to FIG. 11, a diagram illustrating another example package ball placement for a dual-polarity antenna array is shown in accordance with an example embodiment of the present invention. A package 116y may be representative of the packages 116a-116n. Each signal INT and ANTA-ANTD may be implemented as vertically polarized signals INT_V and ANTA_V to ANTD_V and horizontally polarized signals INT_H and ANTA_H to ANTD_H.

The package balls may include two intermediate balls 162a-162b for the intermediate signals INT_V and INT_H, multiple balls 164a-164h for the antenna signals ANTA_V to ANTD-V and ANTA_H to ANTD_H, multiple ground balls 166a-166n for the ground signals GND, and multiple power balls 168a-168n for the power signals VDD. Other package balls may be included to accommodate other signals, power and ground.

The balls 164a-164n for the antenna signals ANTA_V to ANTD_V and ANTA_H to ANTD_H may be located around a circumference of the package 116y. The balls 162a-162b for the intermediate signals INT_V/INT_H may be positioned as inner balls surrounded by the ground balls 166a-166n. By surrounding the intermediate signal balls 162a-162b, the ground balls 166a-166n may create quasi-coaxial transitions and improve signal isolation for the intermediate signals INT_V/INT_H.

Figure 12:
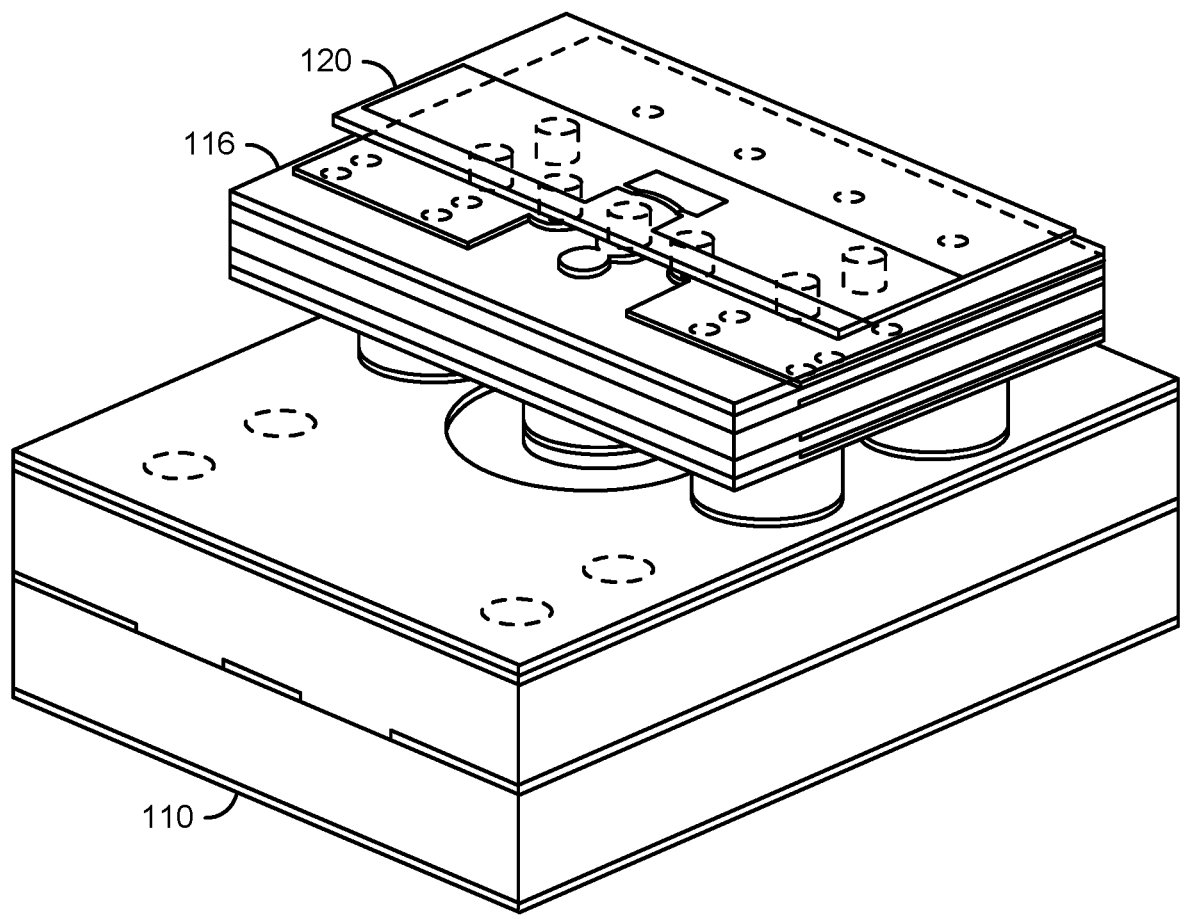
FIG. 12 is a diagram illustrating a chip-to-package transition in accordance with an example embodiment of the present invention.
Figure 13:
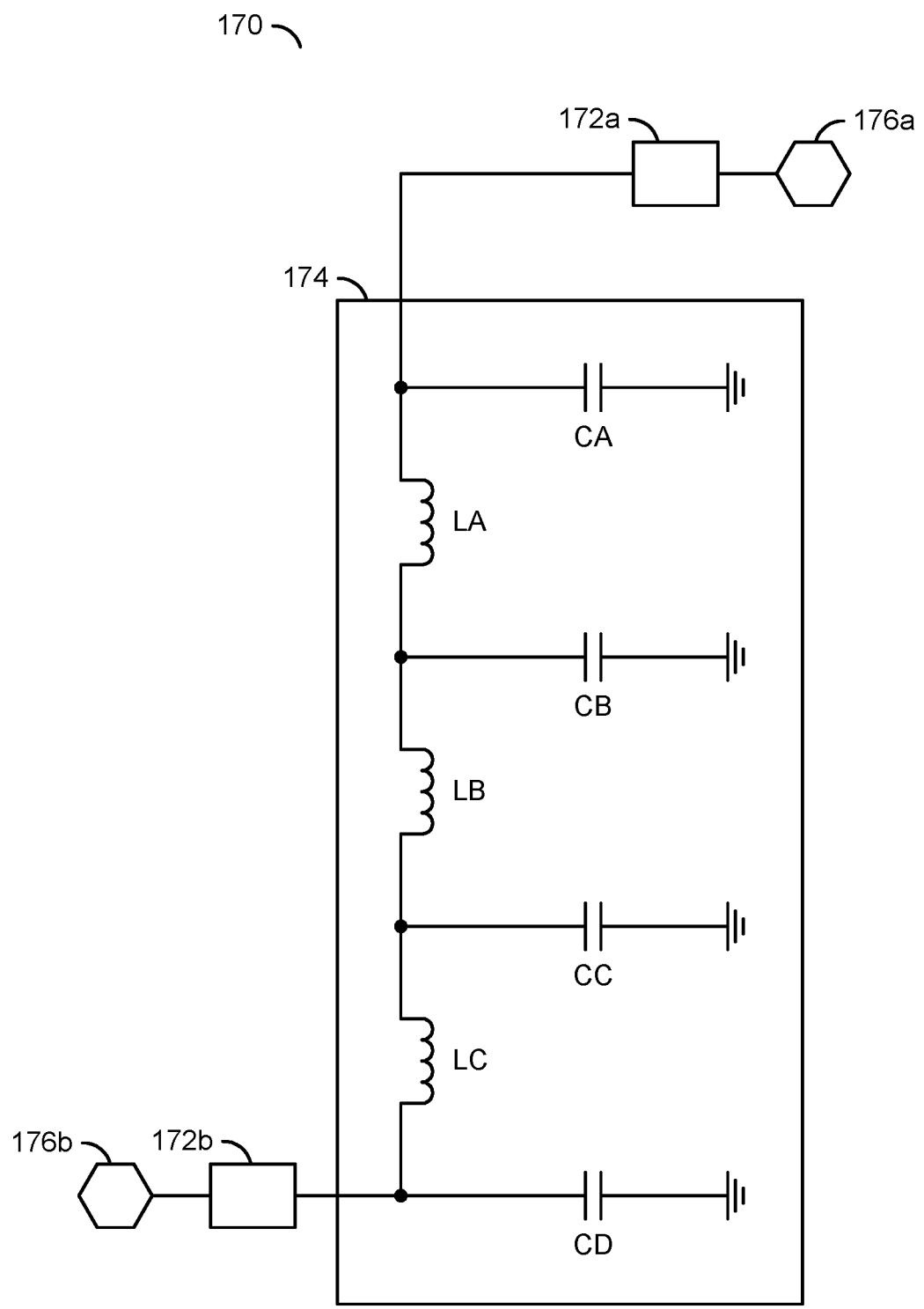
FIG. 13 is a diagram illustrating a transition equivalent model of the chip-to-package transition in accordance with an example embodiment of the present invention.

Referring to FIG. 12, a diagram illustrating an example chip-to-package transition is shown in accordance with an example embodiment of the present invention. The transitions between the chip 120 and the substrate 110 may include quasi-coaxial transitions. The quasi-coaxial transitions may route ground planes, vias, the ground package balls 166a-166n and/or the ground bumps 126a-126a spatially around the package balls and chip bumps that carry the high frequency signals (e.g., the signal INT). The quasi-coaxial transition may be modeled as an inductance-capacitance (LC) type transmission line as shown in FIG. 13. By tuning each section of the transition, an appropriate value for the LC-type transmission line network may be achieved. A size of the opening in metal layers of the package 116 in each section can be tuned to control the capacitance and the shape of the printed line and the location of the vias in the package 116 and the ball locations may be adjusted to achieve an appropriate inductance. The LC-type transmission line method generally accommodates a wide frequency range, may be achieved within limited area and may occupy fewer ground connections than normally implemented.

Referring to FIG. 13, a diagram illustrating an example transition equivalent model 170 of the chip-to-package transition is shown in accordance with an example embodiment of the present invention. The model 170 generally comprises a respective transmission line 172a-172b at each end of a distributed LC circuit 174 and a respective connection 176a-176b at the outer ends of the transmission lines 172a-172b.

The connection 176a may represent a connection within the chip 120. The transmission line 172a may represent a trace resistance within the chip 120 between the connection 176a and a corresponding bump at one end of the LC circuit 174. In various embodiments, the transmission line 172a may have a 50-ohm characteristic impedance. The connection 176b may represent a connection within the substrate 110. The transmission line 172b may represent a trace resistance within the substrate 110 between the connection 176b and a corresponding package ball at the other end of the LC circuit 174. In various embodiments, the transmission line 172b may have a 50-ohm characteristic impedance.

The LC circuit 174 generally comprises multiple inductances LA-LC and multiple capacitances CA-CD. The inductances LA-LC may be arranged in series between the transmission line 172a and the transmission line 172b. The inductance LA may characterize the inductance of a bump between the chip 120 and the package 116. The inductance LB may characterize the inductance of a trace within the package 116 between the corresponding bump and a corresponding package ball. The inductance LC may characterize the inductance of the corresponding package ball between the package 116 and the transmission line 172b.

The capacitance CA may characterize a capacitance to ground of the trace within the chip 120 between the transmission line 172a and the corresponding bump. The capacitance CB may characterize a capacitance to ground of the corresponding bump. The capacitance CC may characterize a capacitance to ground of the corresponding package ball. The capacitance CD may characterize a capacitance to ground of the substrate 110 between the package ball and the transmission line 172b. With carefully designed LC values from the geometry, a transition through the LC circuit 174 with a wideband match to the 50-ohm transmission lines 172a-172b may be achieved.

Figure 14:
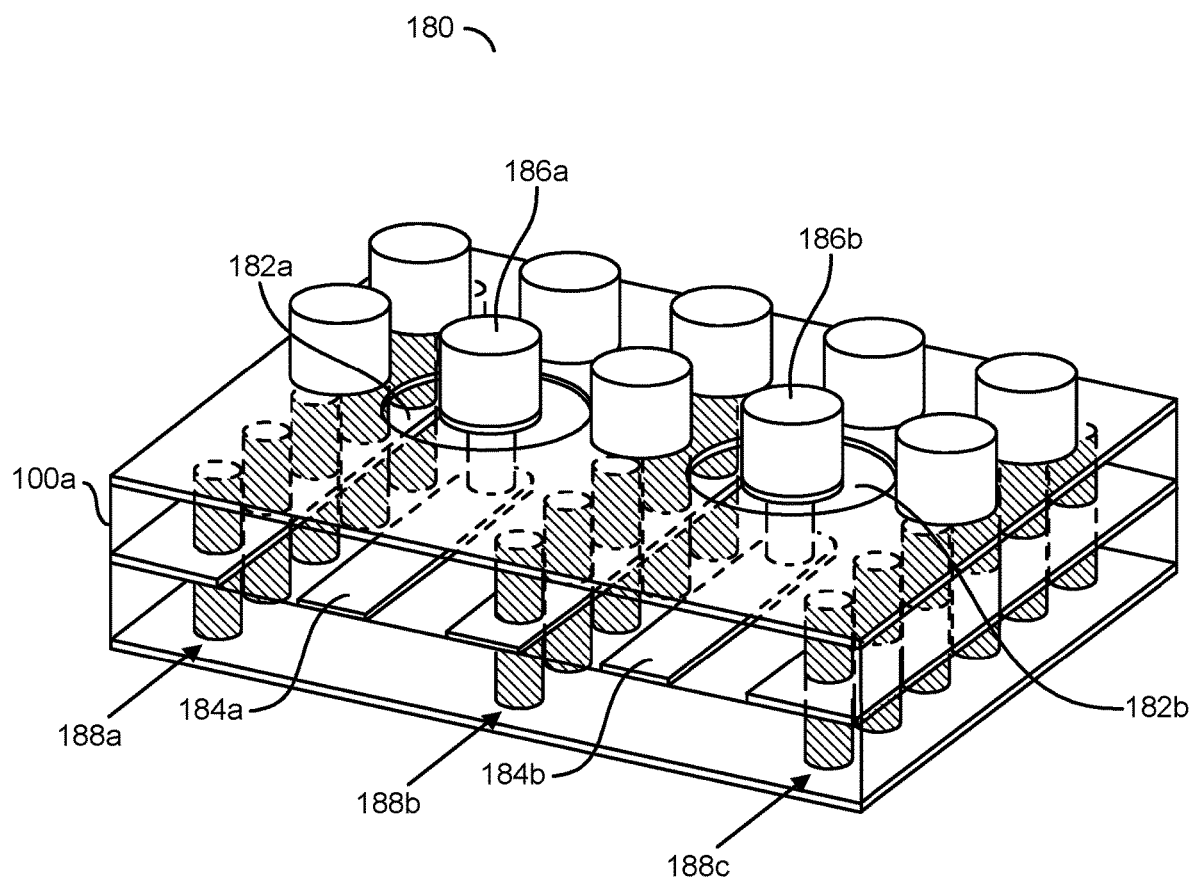
FIG. 14 is a diagram illustrating a channel isolation in accordance with an example embodiment of the present invention.

Referring to FIG. 14, a diagram illustrating an example channel isolation 180 is shown in accordance with an example embodiment of the present invention. For the multi-channel beam former circuits 100a-100n, achieving good isolation between channels may be beneficial to good operation. The channel isolation 180 generally comprises an isolation of the chip 120, the packages 116 and the package balls.

Striplines 184a-184b may be used within each beam former (e.g., 100a) to provide a good initial isolation. The striplines 184a-184b may be coupled to corresponding package balls 186a-186b through via transitions. Parasitic coupling generally occurs around the ball areas, which is typically unavoidable. For example, parasitic coupling may exist between the ball 186a, through a void 182a around the ball 186a and the surrounding conductive planes in the beam former 100a. Likewise, parasitic coupling may exist between the ball 186b, through a void 182b around the ball 186b and the surrounding conductive planes. By maximizing the void areas 182a-182b around the package balls 186a-186b, minimal parasitic coupling may be experienced in the transition area and little to no further coupling may exist after leaving the transition area.

Furthermore, some vias (e.g., the shaded vias) located between the striplines 184a and 184b may be used to form grounded via fences (e.g., see reference numbers 188a-188c). For example via fences 188a and 188b may form shields around the stripline 184a. Via fences 188b and 188c may form shields around the stripline 184b. The via fences 188a-188c generally isolate the striplines 184a-184b from other signals and other circuitry.

A benefit of using the striplines 184a-184b within the beam former 100a is that with proper choice of a substrate thickness, a good transition may be achieved between the chip 120 and the substrate 110. The striplines 184a-184b may also be small enough to fit in tight space between the channels 104a-104d and 106a-106d.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The functions and structures illustrated in the diagrams of FIGS. 1 to 14 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a package configured to be mounted on an antenna array at a center of four antenna elements; and
a beam former circuit (i) disposed in said package, (ii) having a plurality of ports, (iii) configured to generate a plurality of radio-frequency signals in said ports while in a transmit mode and (iv) configured to receive said radio-frequency signals at said ports while in a receive mode, wherein (a) a plurality of ground bumps are disposed between said beam former circuit and said package, (b) said ground bumps are positioned to bracket each of said ports and (c) each of said ground bumps is electrically connected to a signal ground to create a radio-frequency shielding between neighboring ones of said ports.

2. The apparatus according to claim 1, wherein pairs of said ports are symmetrically arranged on opposing sides of said package.

3. The apparatus according to claim 1, wherein (i) said beam former circuit further comprises a plurality of channel circuits connected to said ports and (ii) said ground bumps are disposed between said channel circuits to create said radio-frequency shielding between neighboring ones of said channel circuits.

4. The apparatus according to claim 3, wherein a plurality of power bumps are disposed between said channel circuits as part of said radio-frequency shielding between neighboring ones of said channel circuits.

5. The apparatus according to claim 1, wherein (i) said beam former circuit further comprises a plurality of channel circuits coupled to said ports and a plurality of power bumps and (ii) each of said channel circuits receives electrical power from a neighboring at least one of said power bumps.

6. The apparatus according to claim 1, wherein said beam former circuit further comprises (i) a plurality of signal bumps and (ii) a plurality of striplines configured to carry said radio-frequency signals to and from said signal bumps.

7. The apparatus according to claim 6, wherein an impedance of a transition between at least one of said striplines in said beam former circuit and said antenna array matches that of said striplines.

8. The apparatus according to claim 6, wherein a plurality of voids are provided in a conductive layer of said beam former circuit around said signal bump for channel isolation of said radio-frequency signals.

9. The apparatus according to claim 1, wherein (i) said apparatus comprises a plurality of said packages and (ii) said packages and said antenna elements form part of a two-dimensional antenna network.

10. The apparatus according to claim 1, wherein said radio-frequency signals have a frequency in a range of 24 gigahertz to 44 gigahertz.

11. The apparatus according to claim 1, wherein packages and said antenna elements form part of a fifth generation wireless communications system.

12. An apparatus comprising:
an antenna array comprising a plurality of antenna elements; and
a plurality of packages (i) each mounted on said antenna array at a center of four of said antenna elements and (ii) each housing a beam former circuit, wherein (a) each of said beam former circuits comprises a plurality of ports, (b) each of said beam former circuits is configured to generate a plurality of radio-frequency signals in said ports while in a transmit mode, (c) each of said beam former circuits is configured to receive said radio-frequency signals at said ports while in a receive mode, (d) a plurality of ground bumps are disposed between said beam former circuits and said package, (e) said ground bumps are positioned to bracket each of said ports and (f) each of said ground bumps is electrically connected to a signal ground to create a radio-frequency shield between neighboring ones of said ports.

13. The apparatus according to claim 12, wherein said ports are arranged on all four sides of said packages.

14. The apparatus according to claim 13, wherein a plurality of intermediate ports are (i) arranged inside a circumference of said packages and (ii) configured to exchange said radio-frequency signals with a mixer circuit.

15. The apparatus according to claim 12, wherein (i) each of said beam former circuits further comprises a plurality of channel circuits connected to said ports and (ii) said ground bumps are disposed between said channel circuits to create said radio-frequency shielding between neighboring ones of said channel circuits.

16. The apparatus according to claim 15, wherein a plurality of power bumps are disposed between said channel circuits as part of said radio-frequency shielding between neighboring ones of said channel circuits.

17. The apparatus according to claim 12, wherein (i) each of said beam former circuits further comprises a plurality of channel circuits coupled to said ports and a plurality of power bumps and (ii) each of said channel circuits receives electrical power from a neighboring at least one of said power bumps.

18. The apparatus according to claim 12, wherein each of said beam former circuits further comprises (i) a plurality of signal bumps and (ii) a plurality of striplines configured to carry said radio-frequency signals to and from said signal bumps.

19. The apparatus according to claim 18, wherein an impedance of a transition between at least one of said striplines in said beam former circuit and said antenna array matches that of said striplines.

* * * * *